United States Patent
Gottfried et al.

(10) Patent No.: US 9,614,623 B2
(45) Date of Patent: Apr. 4, 2017

(54) HIGH BANDWIDTH PHOTODETECTOR CURRENT REPLICATOR

(71) Applicants: Noah Gottfried, Johnsonburg, NJ (US); Christopher Mesibov, Airmont, NY (US)

(72) Inventors: Noah Gottfried, Johnsonburg, NJ (US); Christopher Mesibov, Airmont, NY (US)

(73) Assignee: Fujitsu Limited, Kawasaki (JP)

( * ) Notice: Subject to any disclaimer, the term of this patent is extended or adjusted under 35 U.S.C. 154(b) by 27 days.

(21) Appl. No.: 14/835,436

(22) Filed: Aug. 25, 2015

(65) Prior Publication Data

US 2017/0063469 A1    Mar. 2, 2017

(51) Int. Cl.
| | | |
|---|---|---|
| H01J 40/14 | (2006.01) |
| H04B 10/69 | (2013.01) |
| H03F 3/45 | (2006.01) |
| H01L 31/09 | (2006.01) |
| H01L 31/02 | (2006.01) |
| H04J 14/02 | (2006.01) |

(52) U.S. Cl.
CPC .... *H04B 10/6911* (2013.01); *H01L 31/02016* (2013.01); *H01L 31/09* (2013.01); *H03F 3/45071* (2013.01); *H04B 10/6931* (2013.01); *H04B 10/6933* (2013.01); *H04B 10/6971* (2013.01); *H04J 14/021* (2013.01); *H03F 2203/45116* (2013.01); *H03F 2203/45212* (2013.01)

(58) Field of Classification Search
CPC .......... H03F 3/45; H03F 3/45273; H04B 1/06
USPC .............. 250/214 R, 214 A, 214 LA, 214 C; 398/38, 202, 208; 330/59, 110
See application file for complete search history.

(56) References Cited

U.S. PATENT DOCUMENTS

2015/0022267 A1 *   1/2015   Wurcer .................... H03F 1/26
                                                        330/257

* cited by examiner

*Primary Examiner* — Kevin Pyo
(74) *Attorney, Agent, or Firm* — Baker Botts L.L.P.

(57) ABSTRACT

Methods and systems for replicating high bandwidth current outputs from a photodetector or another current source include using a transimpedance amplifier (TIA) to directly generate a TIA voltage that is linear with optical power at the photodetector. The TIA voltage is used to generate a current that flows to a log amp, which generates a voltage that is linear with the optical power in dB. Additionally, offset cancellation is used at the TIA and at the log amp.

14 Claims, 3 Drawing Sheets

HIGH BANDWIDTH PHOTODETECTOR CURRENT REPLICATOR

BACKGROUND

Field of the Disclosure

The present disclosure relates generally to optical communication networks and, more particularly, to a high bandwidth photodetector current replicator.

Description of the Related Art

Telecommunication, cable television and data communication systems use optical networks to rapidly convey large amounts of information between remote points. In an optical network, information is conveyed in the form of optical signals through optical fibers. Optical networks may also include various network elements, such as amplifiers, dispersion compensators, multiplexer/demultiplexer filters, wavelength selective switches, optical switches, couplers, etc. configured to perform various operations within the network.

In particular, optical networks may be reconfigured to transmit different individual channels using, for example, optical add-drop multiplexers (OADMs). In this manner, individual channels (e.g., wavelengths) may be added or dropped at various points along an optical network, enabling a variety of network configurations and topologies. However, such network reconfiguration events may result in power transients among the surviving channels. In particular, steady-state gain offset as a result of network reconfiguration may result in undesired variations in signal power and optical signal to noise ratio (OSNR) in an optical network.

SUMMARY

In one aspect, a disclosed method is for current replication. The method may include receiving, at a photodetector, an optical signal having a plurality of wavelengths and an optical power. Responsive to the optical signal received, the method may include generating a photodetector current when the photodetector is reverse biased with a bias voltage. In the method, the photodetector current may be enabled to flow between a cathode of the photodetector and a negative terminal of a transimpedance amplifier (TIA) having a first feedback resistor. Based on the photodetector current, the method may further include generating a TIA output voltage that is linear with the optical power. The method may further include converting the TIA output voltage to a second current that flows to a current input of a logarithmic amplifier to generate a second output voltage that is linear with the optical power in dB.

In any of the disclosed embodiments of the method, the photodetector may be a photodiode. In any of the disclosed embodiments of the method, converting the TIA output voltage to the second current may further include using a second resistor. In the method, a ratio of the first feedback resistor to the second resistor may scale the second current with respect to the photodetector current. In the method, when the first feedback resistor equals the second resistor, the second current may equal the photodetector current.

In any of the disclosed embodiments, the method may further include applying a first offset canceller output to a positive terminal of the transimpedance amplifier. In any of the disclosed embodiments, the method may further include applying a second offset canceller output to a reference voltage input of the logarithmic amplifier.

In any of the disclosed embodiments of the method, a bandwidth of the TIA voltage may be equal to or greater than 1 MHz irrespective of the photodetector current.

In another aspect, a disclosed circuit is a photodetector current replicator circuit. The circuit may include a photodetector for receiving an optical signal having a plurality of wavelengths and an optical power. In the circuit, the photodetector generates a photodetector current when reverse biased with a bias voltage. The circuit may further include a transimpedance amplifier (TIA) to generate a TIA output voltage that is linear with the optical power. In the circuit, the transimpedance amplifier may have a first feedback resistor, while the photodetector current flows between a negative terminal of the transimpedance amplifier and a cathode of the photodetector. The circuit may further include a logarithmic amplifier for receiving, at a current input of the logarithmic amplifier, a second current generated from the TIA output voltage and for generating a second output voltage that is linear with the optical power in dB.

In any of the disclosed embodiments of the circuit, the photodetector may be a photodiode. In any of the disclosed embodiments, the circuit may further include a second resistor to convert the TIA output voltage to the second current. In the circuit, a ratio of the first feedback resistor to the second resistor may scale the second current with respect to the photodetector current. In the circuit, when the first feedback resistor equals the second resistor, the second current may equal the photodetector current.

In any of the disclosed embodiments, the circuit may further include a first offset canceller having an output applied to a positive terminal of the transimpedance amplifier. In any of the disclosed embodiments, the circuit may further include a second offset canceller having an output applied to a reference voltage ($V_{REF}$) input of the logarithmic amplifier.

In any of the disclosed embodiments of the circuit, a bandwidth of the TIA voltage may be equal to or greater than 1 MHz irrespective of the photodetector current.

Additional disclosed aspects of a high bandwidth photodetector current replicator include an optical communication system and an optical amplifier used in the optical communication system, as described herein.

BRIEF DESCRIPTION OF THE DRAWINGS

For a more complete understanding of the present invention and its features and advantages, reference is now made to the following description, taken in conjunction with the accompanying drawings, in which.

DESCRIPTION OF PARTICULAR EMBODIMENT(S)

Figure 1:
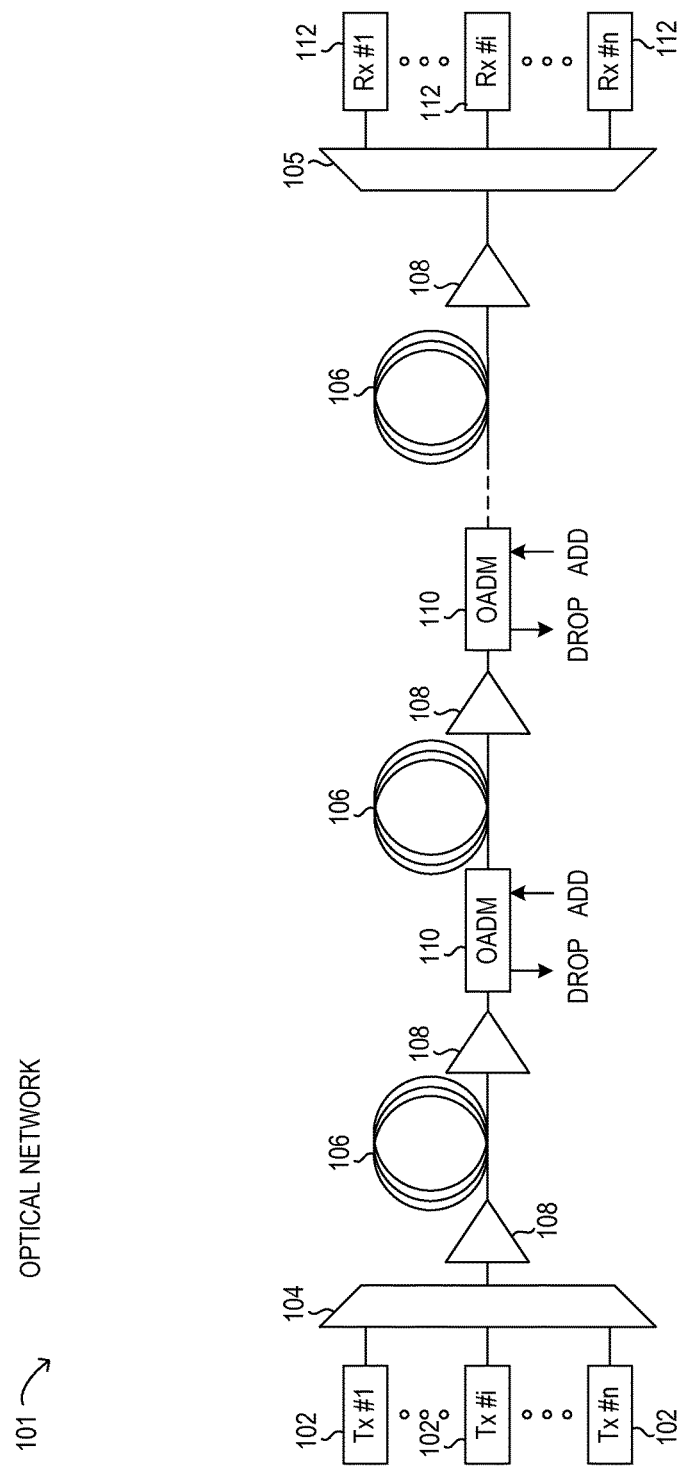
FIG. 1 is a block diagram of selected elements of an embodiment of an optical network.

In the following description, details are set forth by way of example to facilitate discussion of the disclosed subject matter. It should be apparent to a person of ordinary skill in the field, however, that the disclosed embodiments are exemplary and not exhaustive of all possible embodiments.

Throughout this disclosure, a hyphenated form of a reference numeral refers to a specific instance of an element and the un-hyphenated form of the reference numeral refers to the element generically or collectively. Thus, as an example (not shown in the drawings), widget "12-1" refers to an instance of a widget class, which may be referred to collectively as widgets "12" and any one of which may be referred to generically as a widget "12". In the figures and the description, like numerals are intended to represent like elements.

Turning now to the drawings, FIG. 1 illustrates an example embodiment of optical network 101, which may represent an optical communication system. Optical network 101 may include one or more optical fibers 106 configured to transport one or more optical signals communicated by components of optical network 101. The network elements of optical network 101, coupled together by fibers 106, may comprise one or more transmitters 102, one or more multiplexers (MUX) 104, one or more optical amplifiers 108, one or more optical add/drop multiplexers (OADM) 110, one or more demultiplexers (DEMUX) 105, and one or more receivers 112.

Optical network 101 may comprise a point-to-point optical network with terminal nodes, a ring optical network, a mesh optical network, or any other suitable optical network or combination of optical networks. Optical fibers 106 comprise thin strands of glass capable of communicating the signals over long distances with very low loss. Optical fibers 106 may comprise a suitable type of fiber selected from a variety of different fibers for optical transmission.

Optical network 101 may include devices configured to transmit optical signals over optical fibers 106. Information may be transmitted and received through optical network 101 by modulation of one or more wavelengths of light to encode the information on the wavelength. In optical networking, a wavelength of light may also be referred to as a channel. Each channel may be configured to carry a certain amount of information through optical network 101.

To increase the information capacity and transport capabilities of optical network 101, multiple signals transmitted at multiple channels may be combined into a single wideband optical signal. The process of communicating information at multiple channels is referred to in optics as wavelength division multiplexing (WDM). Coarse wavelength division multiplexing (CWDM) refers to the multiplexing of wavelengths that are widely spaced having low number of channels, usually greater than 20 nm and less than sixteen wavelengths, and dense wavelength division multiplexing (DWDM) refers to the multiplexing of wavelengths that are closely spaced having large number of channels, usually less than 0.8 nm spacing and greater than forty wavelengths, into a fiber. WDM or other multi-wavelength multiplexing transmission techniques are employed in optical networks to increase the aggregate bandwidth per optical fiber. Without WDM, the bandwidth in optical networks may be limited to the bit-rate of solely one wavelength. With more bandwidth, optical networks are capable of transmitting greater amounts of information. Optical network 101 may be configured to transmit disparate channels using WDM or some other suitable multi-channel multiplexing technique, and to amplify the multi-channel signal.

Optical network 101 may include one or more optical transmitters (Tx) 102 configured to transmit optical signals through optical network 101 in specific wavelengths or channels. Transmitters 102 may comprise a system, apparatus or device configured to convert an electrical signal into an optical signal and transmit the optical signal. For example, transmitters 102 may each comprise a laser and a modulator to receive electrical signals and modulate the information contained in the electrical signals onto a beam of light produced by the laser at a particular wavelength, and transmit the beam for carrying the signal throughout optical network 101.

Multiplexer 104 may be coupled to transmitters 102 and may be a system, apparatus or device configured to combine the signals transmitted by transmitters 102, e.g., at respective individual wavelengths, into a WDM signal.

Optical amplifiers 108 may amplify the multi-channeled signals within optical network 101. Optical amplifiers 108 may be positioned before and after certain lengths of fiber 106. Optical amplifiers 108 may comprise a system, apparatus, or device configured to amplify optical signals. For example, optical amplifiers 108 may comprise an optical repeater that amplifies the optical signal. This amplification may be performed with opto-electrical or electro-optical conversion. In some embodiments, optical amplifiers 108 may comprise an optical fiber doped with a rare-earth element to form a doped fiber amplification element. When a signal passes through the fiber, external energy may be applied in the form of a pump signal to excite the atoms of the doped portion of the optical fiber, which increases the intensity of the optical signal. As an example, optical amplifiers 108 may comprise an erbium-doped fiber amplifier (EDFA).

OADMs 110 may be coupled to optical network 101 via fibers 106. OADMs 110 comprise an add/drop module, which may include a system, apparatus or device configured to add or drop optical signals (i.e., at individual wavelengths) from fibers 106. After passing through an OADM 110, an optical signal may travel along fibers 106 directly to a destination, or the signal may be passed through one or more additional OADMs 110 and optical amplifiers 108 before reaching a destination.

In certain embodiments of optical network 101, OADM 110 may represent a reconfigurable OADM (ROADM) that is capable of adding or dropping individual or multiple wavelengths of a WDM signal. The individual or multiple wavelengths may be added or dropped in the optical domain, for example, using a wavelength selective switch (WSS) (not shown) that may be included in a ROADM.

As shown in FIG. 1, optical network 101 may also include one or more demultiplexers 105 at one or more destinations of network 101. Demultiplexer 105 may comprise a system apparatus or device that acts as a demultiplexer by splitting a single composite WDM signal into individual channels at respective wavelengths. For example, optical network 101 may transmit and carry a forty (40) channel DWDM signal. Demultiplexer 105 may divide the single, forty channel DWDM signal into forty separate signals according to the forty different channels.

In FIG. 1, optical network 101 may also include receivers 112 coupled to demultiplexer 105. Each receiver 112 may be configured to receive optical signals transmitted at a particular wavelength or channel, and may process the optical signals to obtain (e.g., demodulate) the information (i.e., data) that the optical signals contain. Accordingly, network 101 may include at least one receiver 112 for every channel of the network.

Optical networks, such as optical network 101 in FIG. 1, may employ modulation techniques to convey information in the optical signals over the optical fibers. Such modulation schemes may include phase-shift keying (PSK), frequency-shift keying (FSK), amplitude-shift keying (ASK), and quadrature amplitude modulation (QAM), among other examples of modulation techniques. In PSK, the information carried by the optical signal may be conveyed by modulating the phase of a reference signal, also known as a carrier wave, or simply, a carrier. The information may be conveyed by modulating the phase of the signal itself using two-level or binary phase-shift keying (BPSK), four-level or quadrature phase-shift keying (QPSK), multi-level phase-shift keying (M-PSK) and differential phase-shift keying (DPSK). In QAM, the information carried by the optical signal may be conveyed by modulating both the amplitude and phase of the carrier wave. PSK may be considered a subset of QAM, wherein the amplitude of the carrier waves is maintained as a constant. Additionally, polarization division multiplexing (PDM) technology may enable achieving a greater bit rate for information transmission. PDM transmission comprises modulating information onto various polarization components of an optical signal associated with a channel. The polarization of an optical signal may refer to the direction of the oscillations of the optical signal. The term "polarization" may generally refer to the path traced out by the tip of the electric field vector at a point in space, which is perpendicular to the propagation direction of the optical signal.

In an optical network, such as optical network 101 in FIG. 1, it is typical to refer to a management plane, a control plane, and a transport plane (sometimes called the physical layer). A central management host (not shown) may reside in the management plane and may configure and supervise the components of the control plane. The management plane includes ultimate control over all transport plane and control plane entities (e.g., network elements). As an example, the management plane may consist of a central processing center (e.g., the central management host), including one or more processing resources, data storage components, etc. The management plane may be in electrical communication with the elements of the control plane and may also be in electrical communication with one or more network elements of the transport plane. The management plane may perform management functions for an overall system and provide coordination between network elements, the control plane, and the transport plane. As examples, the management plane may include an element management system (EMS), which handles one or more network elements from the perspective of the elements, a network management system (NMS), which handles many devices from the perspective of the network, and an operational support system (OSS), which handles network-wide operations.

Modifications, additions or omissions may be made to optical network 101 without departing from the scope of the disclosure. For example, optical network 101 may include more or fewer elements than those depicted in FIG. 1. Also, as mentioned above, although depicted as a point-to-point network, optical network 101 may comprise any suitable network topology for transmitting optical signals such as a ring, a mesh, or a hierarchical network topology.

As discussed above, the amount of information that may be transmitted over an optical network may vary with the number of optical channels coded with information and multiplexed into one signal. Accordingly, an optical fiber employing a WDM signal may carry more information than an optical fiber that carries information over a single channel. Besides the number of channels and number of polarization components carried, another factor that affects how much information can be transmitted over an optical network may be the bit rate of transmission. The higher the bit rate, the greater the transmitted information capacity. Achieving higher bit rates may be limited by the availability of wide bandwidth electrical driver technology, digital signal processor technology and increase in the required OSNR for transmission over optical network 101.

In operation of optical network 101, reconfiguration of the optical signals to add or drop individual channels may be performed at OADMs 110. Under such add/drop cases, the surviving channels may systematically be subjected to power transients that result in under gain or over gain. The under or over gain of the surviving channels may accumulate rapidly along cascaded optical amplifiers 108 as this transient gain offset may lead to undesirable variation in output signal power and received OSNR. In particular, as higher bit rates, for example up to 100 gigabits per second, are used for transmission over optical network 101, the received OSNR to achieve such higher bit rates may be reduced due to transient gain (TG) effects. In addition to network throughput, variation in OSNR due to transient gain effects may constrain a transmission distance (i.e., reach) of at least certain portions of optical network 101.

In optical network 101, TG effects may be compensated or minimized dynamically using fast loop control, for example, in optical amplifiers 108. However, in typical optical amplifiers, fast loop control may be limited by the bandwidth response of certain components and signal levels. Specifically, the optical amplifier may include respective optical taps at an optical input and at an optical output for measuring input signal levels and output signal levels in order to regulate the gain of the optical amplifier. The optical taps enable a photodetector, such as a photodiode, to generate an electrical signal indicative of the signal level (or optical power level).

In a typical optical amplifier, the outputs of the photodetectors may be fed to different elements and in some cases, multiple current outputs are used for various purposes, such as gain control regulation. Additional voltage outputs that are indicative of the output photodetector current may also be used for various purposes in an optical amplifier. In some embodiments, the photodetector current flows directly into a current input of a logarithmic amplifier (also referred to as a "log amp") to generate a voltage that is linear in decibels (dB) with the output photodetector current. Because the optical amplifier generally is used to increase the signal power, a current level at an input of the optical amplifier may be smaller than a current level at an output of the optical amplifier. To generate the multiple current outputs, a current replicator (sometimes referred to as a current mirror) is used. However, typical current replicators may come with certain disadvantages when used in an optical amplifier or in other small current amplifiers. Specifically, typical current replicators may not exhibit sufficient bandwidth at low input currents for gain regulation in an optical amplifier where currents as low as 100 nA may occur and where gain regulation bandwidth may be desired at 1 MHz or greater.

As will be described in further detail herein, a high bandwidth photodetector current replicator is disclosed that enables generation of a photodetector current and a second current at a transimpedance amplifier. The high bandwidth photodetector current replicator disclosed herein may provide a first voltage output that is linear with the photodetector current. The high bandwidth photodetector current replicator disclosed herein may also provide a second voltage output that is linear in dB with the photodetector current.

Figure 2:
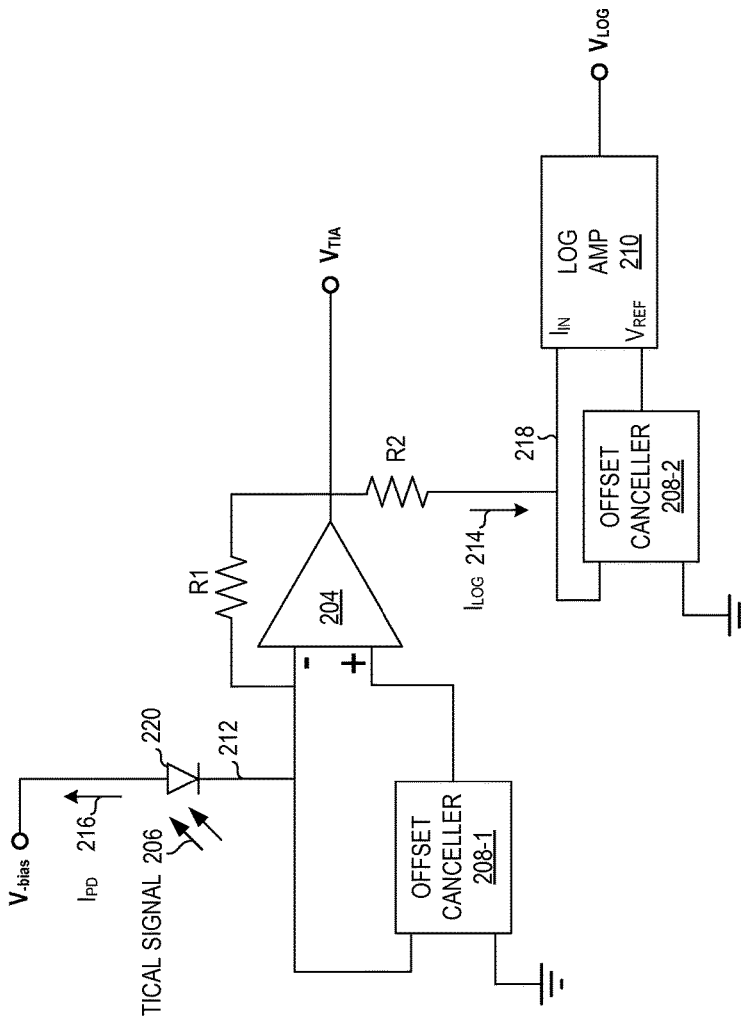
FIG. 2 is a block diagram of selected elements of an embodiment of a high bandwidth photodetector current replicator.

Turning now to FIG. 2, an example embodiment of high bandwidth photodetector current replicator 200 is illustrated in block diagram format. As shown, high bandwidth photodetector current replicator 200 may be used in an embodiment of optical amplifier 108 (see FIG. 1). Optical amplifier 108 may be based on a doped fiber amplification element, such as an erbium doped fiber, and may include a gain control circuit that includes high bandwidth photodetector current replicator 200.

As shown in FIG. 2, high bandwidth photodetector current replicator 200 may represent an electronic device comprising various components and signals between the components, which is shown as a schematic circuit diagram. It is noted that arrows depicted in signal lines in FIG. 2 are intended to show information flow and may not necessarily represent a direction of transmission of a corresponding signal media (e.g., transmission of an optical signal or an electrical current). As shown, photodetector 220 is a photodiode that is reverse biased. However, other types of photodetectors and bias arrangements may be used in various embodiments.

In FIG. 2, high bandwidth photodetector current replicator 200 may be biased by applying $V_{-bias}$. As a result, $V_{-bias}$ is applied at an anode of photodetector 220, which reverse biases photodetector 220.

Then, high bandwidth photodetector current replicator 200 may receive optical signal 206 at photodetector 220. Optical signal 206 may include a plurality of wavelengths and may exhibit an optical power that varies over time. The wavelengths in optical signal 206 may represent individual channels, as described previously. In various embodiments, optical signal 206 may be a WDM signal. Optical signal 206 may be diverted from a transmission line, such as by using an optical splitter or an optical tap (not shown). As photons from optical signal 206 reach photodetector 220 in a reverse biased state, a photodetector current $I_{PD}$ 216 is generated. In other words, photodetector 220 operates as a current source while $I_{PD}$ 216 carries signal information that is contained in optical signal 206. $I_{PD}$ 216 flows at node 212 (the photodetector cathode/negative terminal to TIA amplifier 204) across resistor R1 resulting in generation of a TIA voltage $V_{TIA}$ at an output node of a transimpedance amplifier 204. Transimpedance amplifier 204 may be an operational amplifier that is configured as shown in FIG. 2. Furthermore, a second current $I_{LOG}$ 214 is generated across resistor R2 and flows into node 218 that is a current input to log amp 210. $I_{LOG}$ 214 flows to log amp 210, resulting in generation of a second voltage $V_{LOG}$ that is linear with optical signal 206 in dB.

In high bandwidth photodetector current replicator 200, a ratio of R1 to R2 may be used to scale $I_{LOG}$ 214 with respect to $I_{PD}$ 216 since $(I_{PD}*R1)=(I_{LOG}*R2)=V_{TIA}$. It will be understood that when R1 equals R2, then $I_{PD}$ 216 equals $I_{LOG}$ 214. At logarithmic amplifier 210, $V_{LOG}$ is given by $V_{LOG}=L*\log(I_{LOG})$.

Furthermore, offset cancellation may be performed at TIA amplifier 204 using offset canceller 208-1 and at logarithmic amplifier 210 using offset canceller 208-2. Offset canceller 208-1 allows an accurate TIA output voltage $V_{TIA}$ that is proportional to $I_{PD}$ 216. Offset canceller 208-2 allows an accurate second voltage $V_{LOG}$ that is proportional to $I_{LOG}$ 214. Offset canceller 208 may include a switch-mode auto-zero operational amplifier arranged as an integrator with a low pass filter at the output. As shown in FIG. 2, an output of offset canceller 208-1 is applied to a positive terminal of TIA amplifier 204, while an output of offset canceller 208-2 is applied to the voltage reference ($V_{REF}$) input at log amp 210. At log amp 210, the voltage reference ($V_{REF}$) is also the voltage that appears at current input $I_{IN}$. Thus, even when $I_{PD}$ 216 is very small and $V_{TIA}$ is less than about 1 mV, $V_{LOG}$ remains proportional to $I_{LOG}$ 214. Furthermore, a bandwidth of $I_{LOG}$ 214 fed to log amp 210 is only limited by a design choice of TIA amplifier 204 and R1. The current $I_{LOG}$ 214 may be increased by adjusting a ratio of R1 to R2 and higher current levels into log amp 210 will increase the bandwidth of the response of log amp 210. As shown, the bandwidth of the response of log amp 210 may be greater than 1 MHz and may be irrespective of IPD 216 at any current value, including very small values down to about 100 nA.

Figure 3:
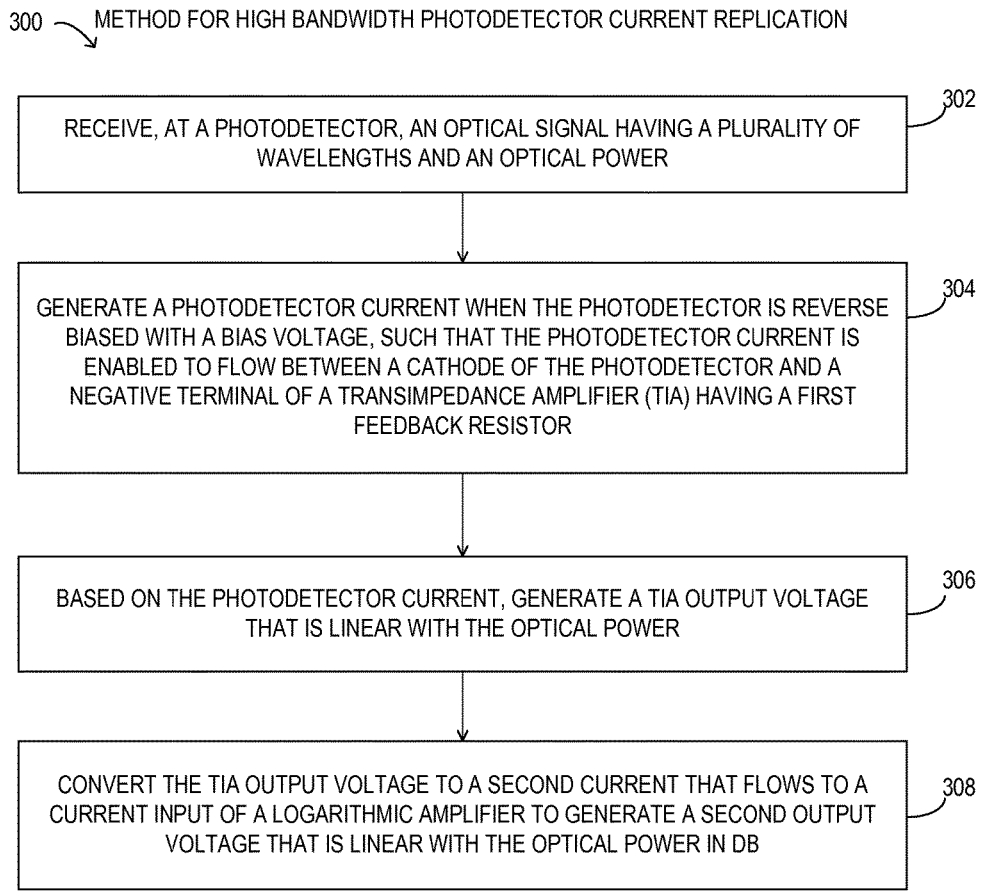
FIG. 3 is a flow diagram of selected elements of an embodiment of a method for high bandwidth photodetector current replication.

Referring now to FIG. 3, a block diagram of selected elements of an embodiment of method 300 for high bandwidth photodetector current replication is depicted in flowchart form. Method 300 may be performed using a circuit such as high bandwidth photodetector current replicator 200 (see FIG. 2), which may be employed in optical amplifier 108 (see FIG. 1). It is noted that certain operations described in method 300 may be optional or may be rearranged in different embodiments.

Method 300 may begin at step 302 by receiving, at a photodetector, an optical signal having a plurality of wavelengths and an optical power. At step 304, a photodetector current may be generated when the photodetector is reverse biased with a bias voltage, such that the photodetector current is enabled to flow between a cathode of the photodetector and a negative terminal of a transimpedance amplifier (TIA) having a first feedback resistor. At step 306, based on the photodetector current, a TIA output voltage that is linear with the optical power is generated. At step 308, the TIA output voltage may be converted to a second current that flows to a current input of a logarithmic amplifier to generate a second output voltage that is linear with the optical power in dB.

As disclosed herein, methods and systems for replicating high bandwidth current outputs from a photodetector or another current source include using a transimpedance amplifier (TIA) to directly generate a TIA voltage that is linear with optical power at the photodetector. The TIA voltage is used to generate a current that flows to a log amp, which generates a voltage that is linear with the optical power in dB. Additionally, offset cancellation is used at the TIA and at the log amp.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A method for current replication, the method comprising:
   receiving, at a photodetector, an optical signal having a plurality of wavelengths and an optical power;
   responsive to the optical signal received, generating a photodetector current when the photodetector is reverse biased with a bias voltage, wherein the photodetector current is enabled to flow between a cathode of the photodetector and a negative terminal of a transimpedance amplifier (TIA) having a first feedback resistor;
   based on the photodetector current, generating a TIA output voltage that is linear with the optical power; and
   converting the TIA output voltage to a second current that flows to a current input of a logarithmic amplifier to generate a second output voltage that is linear with the optical power in decibels (dB).

2. The method of claim 1, wherein the photodetector is a photodiode.

3. The method of claim 1, wherein converting the TIA output voltage to the second current further comprises using a second resistor, wherein a ratio of the first feedback resistor to the second resistor scales the second current with respect to the photodetector current.

4. The method of claim 3, wherein, when the first feedback resistor equals the second resistor, the second current equals the photodetector current.

5. The method of claim 1, further comprising:
applying a first offset canceller output to a positive terminal of the transimpedance amplifier.

6. The method of claim 1, further comprising:
applying a second offset canceller output to a reference voltage input of the logarithmic amplifier.

7. The method of claim 1, wherein a bandwidth of the TIA voltage is equal to or greater than 1 MHz irrespective of the photodetector current.

8. A photodetector current replicator circuit comprising:
a photodetector for receiving an optical signal having a plurality of wavelengths and an optical power, wherein the photodetector generates a photodetector current when reverse biased with a bias voltage;
a transimpedance amplifier (TIA) to generate a TIA output voltage that is linear with the optical power, the transimpedance amplifier having a first feedback resistor, wherein the photodetector current flows between a negative terminal of the transimpedance amplifier and a cathode of the photodetector; and
a logarithmic amplifier for receiving, at a current input of the logarithmic amplifier, a second current generated from the TIA output voltage and for generating a second output voltage that is linear with the optical power in decibels (dB).

9. The circuit of claim 8, wherein the photodetector is a photodiode.

10. The circuit of claim 8, further comprising:
a second resistor to convert the TIA output voltage to the second current, wherein a ratio of the first feedback resistor to the second resistor scales the second current with respect to the photodetector current.

11. The circuit of claim 10, wherein, when the first feedback resistor equals the second resistor, the second current equals the photodetector current.

12. The circuit of claim 8, further comprising:
a first offset canceller having an output applied to a positive terminal of the transimpedance amplifier.

13. The circuit of claim 8, further comprising:
a second offset canceller having an output applied to a reference voltage input of the logarithmic amplifier.

14. The circuit of claim 8, wherein a bandwidth of the TIA voltage is equal to or greater than 1 MHz irrespective of the photodetector current.

* * * * *